United States Patent
McDaniel (10) Patent No.: US 9,959,369 B2
(45) Date of Patent: May 1, 2018

(54) RIGID BODY PROXY FOR MODELING IN THREE-DIMENSIONAL SIMULATION

(75) Inventor: Richard Gary McDaniel, Hightstown, NJ (US)

(73) Assignee: Siemens Corporation, Iselin, NJ (US)

( * ) Notice: Subject to any disclaimer, the term of this patent is extended or adjusted under 35 U.S.C. 154(b) by 777 days.

(21) Appl. No.: 14/355,999

(22) PCT Filed: Nov. 21, 2011

(86) PCT No.: PCT/US2011/061608
§ 371 (c)(1),
(2), (4) Date: May 2, 2014

(87) PCT Pub. No.: WO2013/077833
PCT Pub. Date: May 30, 2013

(65) Prior Publication Data
US 2014/0303943 A1     Oct. 9, 2014

(51) Int. Cl.
*G06F 17/50* (2006.01)
*G06T 19/00* (2011.01)

(52) U.S. Cl.
CPC .............. *G06F 17/50* (2013.01); *G06T 19/00* (2013.01)

(58) Field of Classification Search
CPC ................................. G06F 17/50; G06T 19/00
See application file for complete search history.

(56) References Cited

U.S. PATENT DOCUMENTS

| | | | | |
|---|---|---|---|---|
| 8,626,475 B1* | 1/2014 | Fontes | ............... | G06F 17/5018 700/29 |
| 2003/0090530 A1* | 5/2003 | Ramani | .................. | G06F 17/50 715/848 |
| 2003/0103089 A1* | 6/2003 | Ramani | .................. | G06F 17/50 715/848 |
| 2008/0010041 A1* | 1/2008 | McDaniel | ............... | G06F 17/50 703/1 |
| 2008/0243456 A1* | 10/2008 | Hudetz | ............... | G06F 17/5086 703/7 |
| 2009/0315839 A1* | 12/2009 | Wilson | ................ | G06F 17/5009 345/173 |
| 2010/0030538 A1* | 2/2010 | Cazals | .................... | G06T 17/00 703/6 |

OTHER PUBLICATIONS

Visual Basic http://en.wikipedia.org/wiki/Visual_Basic.
(Continued)

*Primary Examiner* — Kamini S Shah
*Assistant Examiner* — Steven W Crabb (57) ABSTRACT

Modeling is provided in three-dimensional simulation. Proxies are used as virtual rigid bodies to create (22) reusable part files. A custom physics object is defined (22) in the part file using the proxy to allow for control of object behavior, such as control of the rate of spinning of a spindle of a motor. By overriding (28) the part file with the proxy, links to up or owner part files may be made. Changes to physics properties in the different instances of proxies may be made without requiring or resulting in the same change to the other instances. The proxy acts as a virtual rigid body that may or may not move during simulation. The proxy body may be replaced with a rigid body from the assembly when both reference the same geometry object.

20 Claims, 5 Drawing Sheets

(56) References Cited

OTHER PUBLICATIONS

Richard McDaniel "Using a Proxy As a Virtual Rigid Body to Create Reusable Parts" Jun. 2011.
PCT International Search Report dated Aug. 19, 2014 corresponding to PCT International Application No. PCT/US2011/061608 filed Nov. 21, 2011 (12 pages).
Chen Cheng-Jun et al: "Research on Interaction for Virtual Assembly System with Force Feedback", Information and Computing (ICIC), 2010 Third International Conference on, IEEE, Piscataway, NJ, USA, Jun. 4, 2010, pp. 147-150, XP031710881; 2010; US; Jun. 4, 2010.
Martin Ota et al: "Data Exchange in CAD During Iterative Work with Heterogeneous Systems", Cooperative Design, Visualization, and Engineering Lecture Notes in Computer Science;;LNCS, Springer, Berlin, DE, vol. 4101, Jan. 2006(Jan. 2006), pp. 25-32, XP019043153; 2006; DE.

* cited by examiner

RIGID BODY PROXY FOR MODELING IN THREE-DIMENSIONAL SIMULATION

BACKGROUND

The present embodiments relate to simulation. For example, a tool for designing and/or performing a simulation of movement of a model is provided.

A three-dimensional simulation environment may be provided within a CAD tool or other software for simulation of the behavior of a geometric model. Such engineering tools may allow re-use of existing models from libraries. Primitive elements form the basis of the tool. A primitive element is code that may represent an object. Elements may be assembled to make a new, more complex, item. The assembly of elements may be called a part. The part is a file that may be stored as an individual selectable entity for use in the tool. The part may represent an actual part, such as a motor. The part file provides a reference to the part contents of the assembly. For example, if the parts are stored as files, the user may load the part file as the main file to be edited, make changes, and store the modifications. When loading an assembly that references that modified part, the assembly incorporates the changes. Assemblies of parts may also be created as part files and may be included by reference in the file into other assemblies.

A full CAD or simulation model may be realized as a hierarchy of parts represented in part files. The graph of parts is restricted to being acyclic in order to avoid endless loops or failure of the simulation. This means that a part file cannot include a reference to itself either directly or through a chain of other referenced part files. Similarly, a part file cannot reference a part file that already references itself. As a result, there is a well defined owner-child relationship between connected part files. Though cycles are prevented, an assembly may still include a part multiple times either directly or by including other parts that also include a common part. However, the owner-child relationship between referenced part files causes some restrictions on how items represented within the part files may interact. In general, an item in a part file may reference objects in part files that are included and their sub-parts. This makes sense in that part files are included in the first place so that their items may be used. However, going the other way where a part file refers to items defined in its owner or part file above it is not workable. A part file that gets included in another does not know a priori which part files to which the part file will become attached. Presumably, a part file may be included in many different assemblies so the items in the owner cannot be known.

SUMMARY

A way to remedy this problem is to create interface objects where an included part file is parameterized with the items used within its own definition. This is a kind of proxy where an interface object is put within a part and serves as the vehicle to make upward references. However, this proxy interface is made explicit and is something the user must manage directly.

In various embodiments, systems, methods and computer readable media are provided for modeling in three-dimensional simulation. Proxies are used as virtual rigid bodies to create reusable part files. A physics object is included in the part file for the proxy to allow for control of motion of the virtual rigid body, such as control of the rate of spinning of a spindle of a motor. By overriding the part file with the proxy, upward links to items in the owner part files may be made. Changes to physics parameters in the different instances of proxies may be made without requiring or resulting in the same change to the other instances.

In a first aspect, a method is provided for modeling in three-dimensional simulation. A processor operating on a part file parameterizes a first proxy body that acts as a proxy for rigid body behavior. The processor instantiates the part file multiple times in a model of an assembly. The processor propagates properties of a first physics object to the multiple instantiations of the part file. The properties are settable differently for different ones of the instantiations, and the first physics object defines mass, movement, velocity, and/or articulation of the first rigid body. A first rigid body is defined in the assembly. The first rigid body is associated with the first proxy body through indirect relationship with shared referenced objects. The processor simulates the assembly as a function of the multiple instantiations of the part file and the respective properties.

In a second aspect, a non-transitory computer readable storage medium has stored therein data representing instructions executable by a programmed processor for modeling in three-dimensional simulation. The storage medium includes instructions for storing a part file including a proxy body and associated physics, using the part file multiple times for different instances of a corresponding part in an assembly, defining the physics of the proxy body for each use of the part file for the different instances separately, and controlling, with the defined physics, each instance separately.

In a third aspect, a non-transitory computer readable storage medium has stored therein data representing instructions executable by a programmed processor for modeling in three-dimensional simulation. The storage medium includes instructions for placing multiple instances of a part in the three-dimensional simulation, each part comprising a part file with a proxy body object, defining properties representing an interface to the proxy object in the part file, and maintaining values of the properties for the different instances of the part separately during simulation.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EMBODIMENTS

Simulation objects are specified in the context of a three-dimensional CAD-like engineering tool. Objects are identified from a list of typed properties to create new types dynamically in a CAD-like engineering tool. Class definitions describe the structure of simulation objects. The ability to create "up" references implicitly is made possible by the use of rigid body proxies. Creating rigid body objects for a proxy or not may depend on how a referenced part is used.

The contents and interface for proxy objects are defined as a list of properties. Proxy definition objects are stored in part files and are associated with a list of properties, a set of encapsulated physics objects, and a set of geometric items that constitute the body of the object the proxy represents. Proxy override objects (e.g., instantiations of the proxy objects) are stored in assemblies that include a part file where a proxy definition object is included. The proxy definition object from the part file defines the properties whose values may be changed to be correct for the given use or instance within the assembly. The proxy override object is used to define the instance values within the assembly.

The user attaches the proxy object to joints and other physics objects as though the proxy object were a rigid body in a part. Geometry items may be attached to a proxy definition object in a part. A geometry item attached to the proxy can be attached to an actual rigid body if desired in an assembly that owns the part. When the simulation runs, references to the proxy becomes replaced with the rigid body if it is associated with the proxy's geometry. The proxy remains static or ignored within the simulation if no such rigid body were created.

Figures 1, 10:
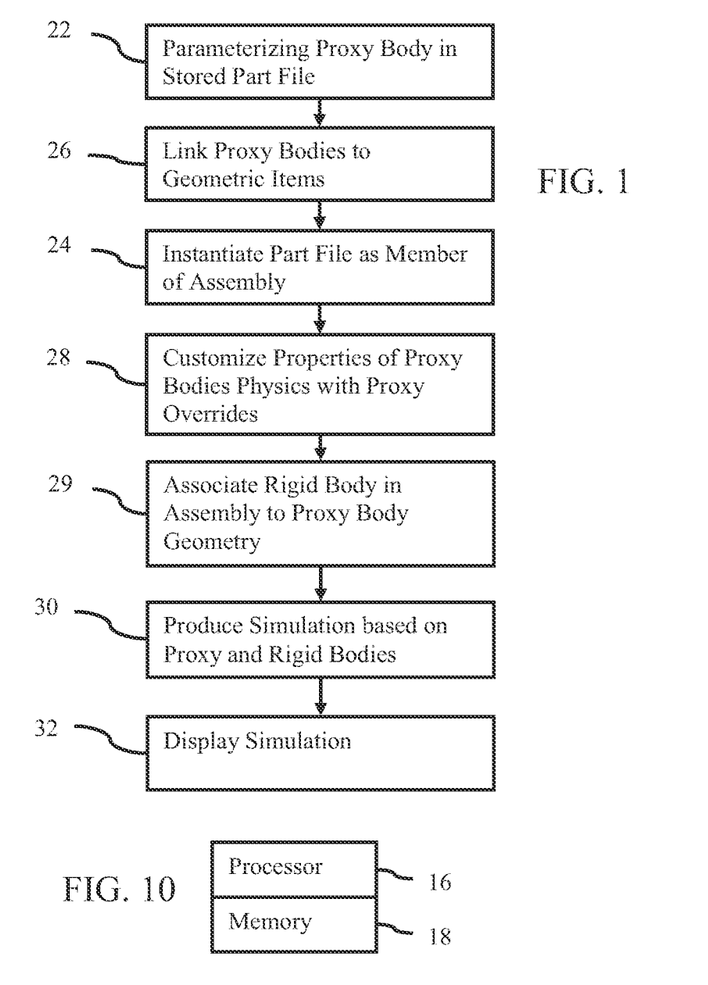
FIG. 1 is a flow chart diagram of one embodiment of a method for modeling in three-dimensional simulation.
FIG. 10 is block diagram of one embodiment of a system for modeling in three-dimensional simulation.

FIG. 1 shows a method for modeling in three-dimensional simulation. The method is implemented by the system of FIG. 10 and/or a different system. A processor performs the acts, such as pursuant to instructions, programming, or circuit design. Additional, different, or fewer acts may be provided. For example, act 29 is not performed where the proxy is to remain static relative to the background. Acts 30 and 32 may not be performed, such as where the method represents design of a model. Acts 30 or 30 and 32 may be performed without act 28, such as where the physics of each proxy operates with the same values.

The method is provided in the order shown. Other orders may be provided. For example, act 28 is performed as an override during the simulation of act 30. As another example, the display of act 32 may be performed throughout the simulation of act 30.

In act 22, a proxy body is parameterized in a stored part file. The part file is one collection or set of code for a particular part. The part may be one or more devices, such as an assembly of components. The part file may include sub-parts for the various components or may be a collection of properties together defining the components without sub-sets.

The part file is stored. The part file is readable by a processor. The processor stores the part file as part of or after creation. The part file is stored in a computer accessible memory.

To create the part file, the processor operates on an existing part file, begins with a template, or provides for creation as new. To use the part file, the processor loads or accesses the part file from memory. The processor may operate on the part file to design a model or to simulate operation of the model.

The part file for a proxy includes a proxy body and associated physics and geometry. The physics, geometry, or other associated objects may be stored in other part files that are included or referenced by the proxy body's part file. Values for parameters in the file indicate the list of properties with initial values, geometry, and referenced physics objects. The part represents one or more actual objects, such as a motor part. The part file for the motor may include parameters defining a cylinder geometry for an outer casing, a rod geometry for a spindle, and physics of operation of the motor to spin the spindle. Other body and/or physics representations may be used.

The part file for a proxy body includes one or more physics objects parameterizing the operation of the components or elements represented by the part file. Physics simulation objects are defined as part of the part file within the CAD modeling system. The physics objects represent physical capabilities, such as movement, mass, velocities, and articulation. The physics objects define these physical capabilities of the proxy body.

The rigid body object may interact with connected or linked objects in simulation. The physics objects model a connection between a rigid body and another rigid body or joint. The physics objects may include items that model connections and kinematics between rigid bodies. Bodies (e.g., objects) are associated by reference to different kinds of connector objects or joints. A joint may connect two rigid bodies or connect a single rigid body to the background. For example, a hinge joint connecting two rigid bodies may allow the two bodies to have one or more degrees of freedom such that the two rotate and/or translate with respect to one another. The operation of the rigid body of the part file may interact with other components, so the physics object indicates the parameters of the operation. Since the proxy body potentially acts as a rigid body, all connections available for rigid body are equally available for proxy body.

The physics objects are stored directly in the part files. In other modeling tools, physical objects are managed with a secondary set of files and kept separate from the geometry. By including the physics objects in the part file, the physics objects may be easily separated amongst the part files and grouped into reusable units.

The simulation system includes options to assign or otherwise modify values of physics objects during creation, design, and/or runtime. For example, physics objects may have properties that may be set when the user activates a dialog. There may also be a programming process that reads physics properties to detect conditions and assigns values to physics properties as needed while the simulation is running.

The property list defines a custom interface to a user-defined physics object by the proxy body in the part file. A part file may include references to other part files defining that part file as an assembly. An assembly may include multiple references of the same part file either directly or indirectly. The physics of the multiple instances may be handled independently of each other. A proxy body defined in a part that is included multiple times into an assembly can be treated as the number of instances of the included part.

The part file can include a rigid body that is to move during simulation. The primary physics object is a rigid body object. Rigid body objects represent physical entities that can move. A rigid body may be described as a separate object or a property of geometric entities. In one embodiment, a rigid body is a grouping of geometric entities. The rigid body is a collection of geometric objects that move together in the simulation. Moving together includes the same translation and/or rotation. The geometric objects in a single rigid body move as one entity. Multiple rigid body objects may also move relative to each other, such as the spindle of a motor moving relative to the housing where the housing and the spindle move as separate objects. All the geometric objects that move are associated with rigid body objects.

The rigid body may be precluded from having a direct connection for shared movement with another rigid body. All geometric objects moving together in the simulation are in the one collection and corresponding rigid body. During creation, the user selects a set of geometries that include all geometry that is connected and then groups them together as a rigid body. The selected geometries may include entities that are included as parts of the assembly. The semantics of the rigid body preclude two rigid bodies being attached to the same geometry. Thus, if a given geometry is part of one rigid body, that geometry is not made part of another rigid body. Multiple rigid bodies may be merged such that two or more rigid bodies become a single rigid body.

The part file defines the proxy body and the physics objects associated with the proxy body. The proxy body acts as a replacement of the rigid body to allow reuse of the proxy body and the associated physics in different assemblies. The proxy body is a means for re-use and encapsulates physics objects within a CAD-like engineering tool. Reusable, functional higher-level objects, such as sensors and motors, can be created. These high-level objects or assemblies of the part file may be incorporated into a design and function as that kind of object in simulation. For example, a motor object is able to convert a virtual electric current into the animated motion of the 3D geometry attached to the motor's spindle. Defining such a motor from primitive physics objects may require the integration of several objects along with behavioral programming to mimic the behavior of the actual motor. Thus, being able to encapsulate primitive parts into the motor object as a single reusable part and drop the part represented by the part file into a design may provide efficiencies in design or model simulation.

The proxy body object is used to define new classes of physics objects. The user may or may not see the proxy body as a new class. Instead, the user sees the physics object defined by the proxy body in the corresponding part file. For example, if the proxy body defines a motor as a physical object, the user will be able to see, instantiate, and manipulate motor objects. One function of the proxy body is to define a set of properties that represent the interface to the custom physics object class. These properties may be treated by the system in the same way as properties for primitive physics objects. The properties of the proxy body are used as the runtime properties of the custom physics object during simulation. Runtime properties are maintained and updated when the simulation runs to display and manage the state of the simulation over time. For example, if a motor has a speed parameter, the speed parameter may represent the speed at which the motor is turning during simulation. Changing the speed at runtime causes the motor to begin turning at a different speed.

A proxy body can be made an instance by including its part file into an assembly. The proxy object is defined by a property list of values modifiable during simulation, encapsulation of the physics object to implement operation of a simulated part, and geometric objects corresponding to a potential rigid body that can be substituted during simulation. The user creates a new proxy object by producing a proxy definition in the part file corresponding to the physical entity. Including a part file into an assembly makes the proxies that are defined in the part file available. For example, if the user creates a motor proxy definition in the motor part file, including the motor part into an assembly, say a robot arm, the user may apply the function of the motor to the other physics objects and operations. Thus, the motor part is used to make the robot arm move as though the arm were being driven by the actual motor.

Figure 2:
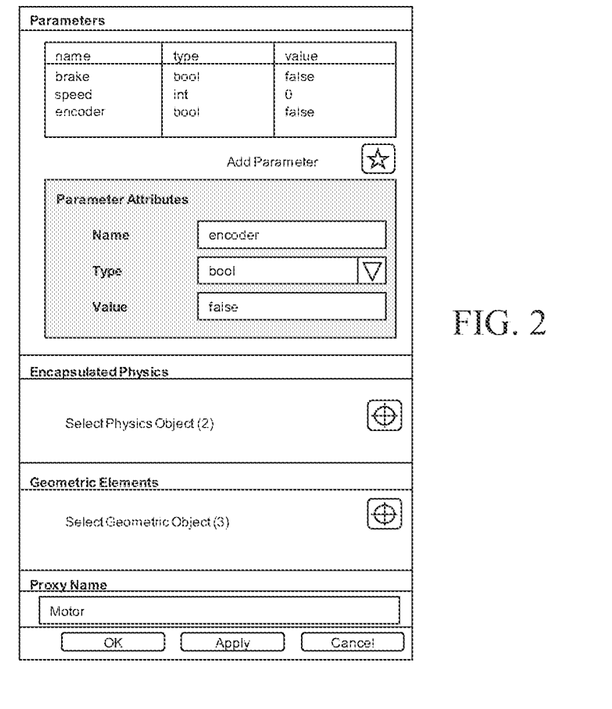
FIG. 2 is an illustration of a dialog for creating a proxy definition object according to one embodiment.

The proxy definition in the part file may have any format with any types of data. In one embodiment, the proxy definition includes four sections. During creation, the user defines a name for the proxy's class, a list of one or more properties, the set of one or more physics objects to encapsulate, and the set of one or more geometric objects that represent the physical object. The proxy name is used in menus, windows, and dialogs in order to distinguish it from other object classes. FIG. 2 shows an example dialog for creating a proxy definition object or proxy body. The proxy name is "motor."

The list of properties denotes the set of values that may be read and modified before and/or during simulation. The property list defines the runtime properties of the proxy object. For example, a motor might have the properties for brake on/off, the speed, and output for an encoder wheel. Properties may be defined with a name, type, and initial value, such as represented in FIG. 2. The dialog includes various fields for the various parameters, as well as the type of values for the parameters and the values of the parameters. For the motor speed, the name may be "speed," the type may be integer or another type, and the initial value may be zero or another number. Other supported types may include floating point numbers, Booleans, strings, references to physics objects (e.g., reference to a rigid body or joint), and user-defined types, such as enumerations (e.g., constant) and collections (e.g., array or struct). Other parameterization may be used.

The set of encapsulated physics objects denotes which physics objects within the part file and the sub-parts thereof are considered part of the proxy object's implementation. The set of encapsulated physics objects takes physics objects that are available in the proxy part and hides them from the assemblies that include the proxy. Hiding the part corresponds to including the code defining the part within the part file for an assembly for use but without separable definition or configuration by the user when modeling. The user may not be allowed to change the nature of the operation of the hidden objects (e.g., may not change a hinge object to a sliding joint object). The hidden physics objects are to be used for the implementation of the proxy. For example, a motor may be defined by a hinge joint to define the axis of rotation and a speed constraint to make the hinge turn on demand. These objects are semantically subsumed by the motor and are not meant to be manipulated by a user of the motor object to prevent interfering with operation. The speed, range, or other characteristic of operation may be set by the user through the properties of the motor, but the basic or fundamental arrangement and operation is encapsulated. By encapsulating the physics objects used in implementation, the user of a proxy part does not have access to those physics objects and may not directly manipulate the way in which the object operates. For debugging purposes, the encapsulated physics objects may viewable at runtime.

Proxy objects included within a part may also be encapsulated by a proxy definition in that part. By doing so, the included proxy object becomes unavailable to the parts higher in the hierarchy. For example, a motor part might include an encoder part in the assembly for the motor. The included encoder part is used to implement the encoder aspect of the motor. By putting the encoder proxy object in the motor's encapsulated physics list, the encoder object is not seen by assemblies that include the motor part. Of course, an assembly may include an encoder part for itself that is visible. Encapsulating physics objects only hides the objects referenced by the proxy definition's part.

The set of geometric objects are the CAD or other object models that define the proxy's physical size and material aspects. The proxy body may include one or more geometric objects in an assembly. The geometric objects represent the geometries that a rigid body would have if the proxy body is to be moved in simulation. A rigid body similarly possesses a grouping of one or more geometric items. The proxy definition object may optionally be used to group geometric items. The models that represent the physical representation of the device are assigned to the proxy. For example, the cylinder for the housing is assigned to the motor proxy. The geometric group is treated similarly to a rigid body except that the group's ability to move is not known merely by inclusion in the part file for the proxy. The user may wish for the proxy object's geometry to move or the user may want the geometry to be static background objects.

Geometric objects not currently associated with a rigid body may be associated with the proxy definition in act 26. Geometric objects associated with a rigid body available in the proxy body's part may not be associated since geometry cannot be used by two rigid bodies at once. This rule may be relaxed if the rigid body is an encapsulated member of the proxy definition. For example, if the spindle geometry is grouped with a rigid body and the rigid body is made a member of the proxy body's encapsulated physics objects, then the spindle geometry may be added to the proxy body's geometry set. The interpretation of this configuration is the geometry of independent rigid bodies within the proxy body are not considered members of the proxy body's geometry if it becomes converted to a rigid body itself. The geometry of encapsulated rigid bodies may be automatically stripped from the proxy definition's geometry group.

When a geometric object is a member of another grouping, such as a collision body, all members of the grouping are added to the proxy definition when any one is selected to be a member of the proxy definition. The assignment of a geometric object to the proxy works in the same way as selection for rigid bodies. When geometric objects are grouped such that the geometric objects are expected to move together as a unit, then all members are added so that the geometries move together.

Act 22 may be performed as part of creating the part files to allow use and reuse in a model. The part file and corresponding proxy bodies may then be used in design or construction of a model and the corresponding simulation.

In act 24, the part file is instantiated in a model of an assembly, perhaps multiple times. The processor performs the instantiation in response to user selection. The user may select a given part and place the part in one or more locations in an assembly. In response, the processor instantiates the part file one or more times as the proxy body. Each placed part is an instance of the part file with the corresponding physics objects. From the user perspective, an icon or graphical representation of the part represented by the part file is placed at the desired locations of the assembly in the three-dimensional simulation.

Rigid bodies are generated in one or more assemblies. A rigid body in an assembly can group available geometry items as included geometry items defined in parts. The geometry items may also be members of the proxy body in a part. The geometric objects of the proxy body are included together when included in a rigid body as the members of the same proxy are expected to move together. Geometry items in the part that are members of other rigid bodies are not allowed to be grouped with new rigid bodies. Geometry items that are members of rigid bodies that are encapsulation members of the proxy body are not added to the assembly's rigid body. By instantiating the part file, each proxy has a proxy definition from the part file. The same part file is used multiple times for the different instances of the corresponding part in the assembly. The part with the proxy definition is loaded into the assembly. The proxy allows reuse in the same assembly, model, or simulation of the previously created object.

When a part with a proxy definition is loaded into an assembly, that proxy object becomes available to be used in the assembly. Similarly, unless the proxy object is encapsulated, when the assembly is added as a part of another assembly, that other assembly also has access to the proxy object.

The values of the properties of the proxy body are allowed to be changed in order to customize the instance of the part for use in the respective assembly. The values of the parameters defining the physics operation may be modified. The modification or change of values can occur either during design of the model or during simulation is handled by a proxy override. Override objects act as the different instantiations of the proxy object and record the change of the values. An override object may be available to any assembly, such as the upward assembly of an assembly of which the part is a member.

Figure 3:
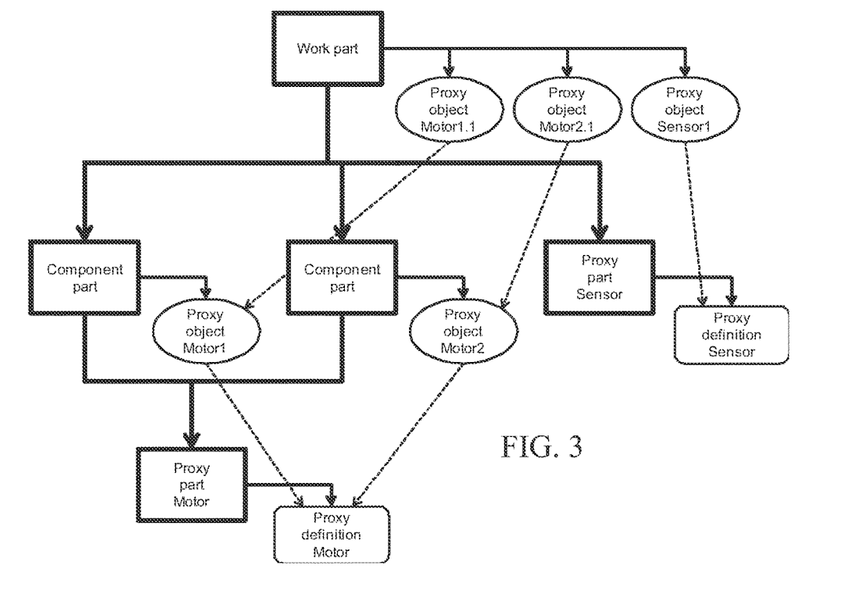
FIG. 3 is an example graph showing linking of proxy definition values to assemblies within a model.

FIG. 3 shows an example creation of a model using a part file defining proxies. The proxy override objects are also illustrated. In this scenario, two parts with proxy definition objects are a motor and a sensor. The part file for the motor and the part file for the sensor are selected from a library or list. The motor proxy is defined in the part file named "Motor" and the sensor is defined in part file "Sensor." The scenario defines three assembly parts: two labeled "component" and the third labeled "work." The component parts are included in the assembly for the work part. The two component parts each include an instance of the motor proxy part, and the work part includes the two component parts as well as an instance of the sensor proxy part. The thick lines in the diagram represent the reference of the part within a given assembly. The thin lines represent objects that are contents for a particular part file. The roundtangle boxes represent proxy definition objects and the ellipses represent proxy override objects.

Figure 4:
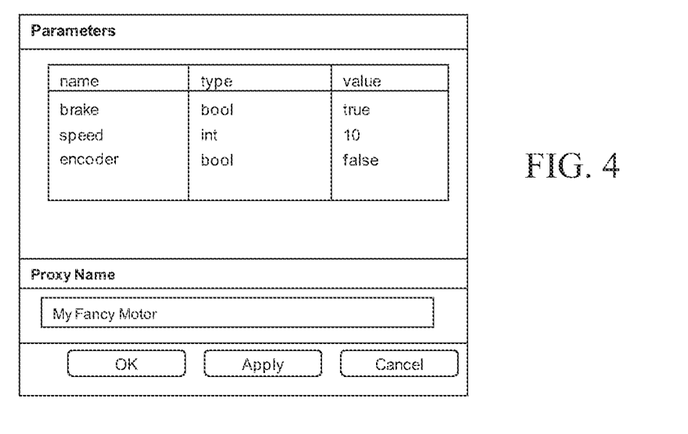
FIG. 4 is an illustration of one embodiment of a dialog for editing a proxy override.

The two component parts show that the motor proxy definition is instantiated into proxy override objects, "Motor1" and "Motor2." In the proxy override, the user may change the values of the proxy's properties to customize the behavior of the proxy object for that context. An example for how a dialog might look for setting the proxy override's properties is shown in FIG. 4. For example, Motor1's speed may be initialized to the value 100, but Motor2's speed is set to 20 because in the second component, for whatever reason, the motor is supposed to move more slowly.

When the component parts are included in the work part, the motor objects from each component stay separate. New proxy override objects are available in the work part so that the property values may be further refined. For example, the proxy object "Motor1.1" is not supposed to move at the full speed of 100 so the user modifies the value to be 80. The value of the proxy override for the speed property in Motor1 is still 100 and Motor2 is still 20, but the motor is simulated to operate with the value at 80 due to the work part's override object.

In act 29 of FIG. 1, the rigid body in the assembly file may be linked with a geometric object. The instantiation of the proxy body provides reference to the proxy definition that links to geometric objects in the part file. These geometric objects are linked or not linked with rigid body objects in an assembly, such as geometric objects of the component parts in FIG. 3. Proxy objects are either moving or static, depending on how the user defines rigid body objects in the assembly. If the proxy definition refers to geometry that is not already a member of a rigid body, then those geometries are allowed to be linked to a rigid body in an assembly if no other assembly has already done so. A linked geometry will be moving in the simulation if the user includes that geometry in a rigid body object and static otherwise.

In act 28, the properties of the physics objects are propagated to the instantiations of the part file. The proxy override objects are used by the processor to define the properties of different instances of the proxy body differently. Each use of the part file for the different instances has the physics defined separately by propagation of different values of the properties in the assembly file. The properties of the physics objects in the proxy body are settable differently for different ones of the instantiations. By overriding the properties of the physics object for one or more of the multiple instantiations, the part file may be reused but with independent (e.g., different or the same) values and operation.

The propagation is performed by entering or changing one or more values, such as using the dialog shown in FIG. 4. The values are entered when the model is assembled, such as entering the values for the override objects when the design or model of FIG. 3 is assembled by the user. The values are or are not changed for one or more of the instances of the proxy body.

In another embodiment, the values are entered during the simulation. The properties of the physics object are overridden for one or more of the multiple instantiations while simulating and displaying the simulation in acts 30 and 32. The modification is performed during a runtime of the simulating. After a start of the simulation and prior to a completion of a continuous run through the simulation, the user or processor causes one or more values to change for one or more instances. The corresponding physics operation is modeled differently by the processor as a result of the change. The simulation reacts to the change during runtime, allowing the user to visually examine the repercussions of the change in physics. At the end of simulation, the values of the properties may be restored to their values before simulation.

The proxy part defines simulation behavior in that the runtime properties created in the definition act as actual memory to store values when the simulation is running. The proxy object may either be run directly in the definition part or run starting with proxy override values when run in an assembly that includes a proxy part. Functions or calls that modify the parameters of physics objects may store and retrieve the values of the properties and may create and destroy proxy objects as would be possible with other physics objects.

In act 30 of FIG. 1, movement of the model or assembly is simulated. The simulation is produced based on the proxy and rigid bodies. The designed or assembled model is used in a two or three-dimensional simulation. Using the user positioned rigid bodies, proxies, parts, and/or assemblies with the physics objects embedded in the corresponding part files, the interaction of the model is calculated.

The processor simulates the assembly as a function of the one or more instantiations of the part file for the proxy and the respective properties. The processor controls each instance, the corresponding physics objects of the proxy bodies, and other parts of the model. For the proxy bodies, each instance may be controlled separately by the independently defined physics parameters.

Figure 5:
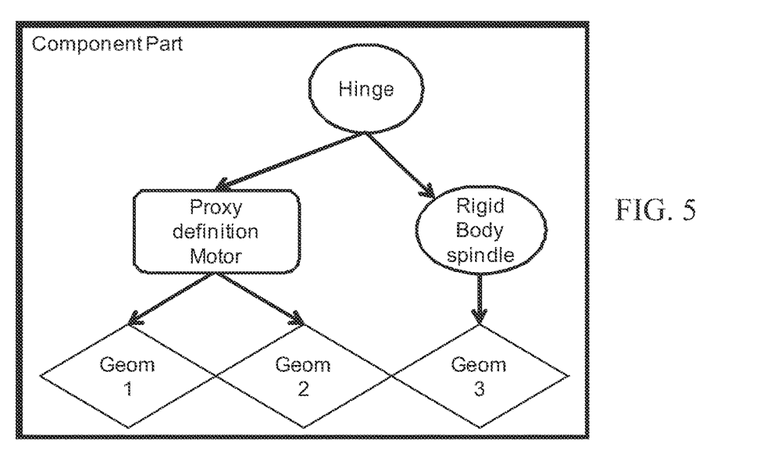
FIG. 5 is an example graph showing a proxy part with a physics object according to one embodiment.

The control may be for modeling a connection between the proxy body and a second rigid body through a joint, based on the physics. Where a first rigid body in an assembly is associated with the proxy body, the physics modeling of the operation of the first and second rigid body simulates movement with joint connection or operation with other objects. The proxy object, both definition and override, may be associated with other physics objects and/or rigid bodies. For example, a rigid body is connected to a joint, such as a hinge. To allow two rigid bodies to rotate with respect to each other, the two rigid bodies are connected to a hinge joint. One rigid body is the attachment object and the other rigid body is the base object of the joint object. The proxy bodies may be treated as rigid bodies so that the user may store references to the proxy body as the attachment and/or base of the hinge joint. FIG. 5 shows an example where a hinge joint is connected to a normal rigid body as the attachment and uses a proxy object as the base. The proxy overrides may be attached to joints and other rigid body referencing physics objects.

Depending on the association of a rigid body to a given instance of a proxy body, the proxy body's geometric objects may move with the rigid body or may be maintained in a static position relative to the background. The meaning of referencing a proxy body to a joint or similar physics object depends on the context of how the part is applied when the simulation runs. A proxy body by itself is not a rigid body. Rigid bodies are objects that move. This is an important property because sometimes the user models the proxy to work like a background, static object. For example, if a proxy part for a motor always had a rigid body attached to its geometries, the motor would always move. So, if the user did not specifically connect the motor to something fixed, such as by fastening the motor to part of a machine, the motor would fall down. In a simulation, sometimes objects are just static and do not move. Objects should not fall unless the user wants that behavior.

Figure 6:
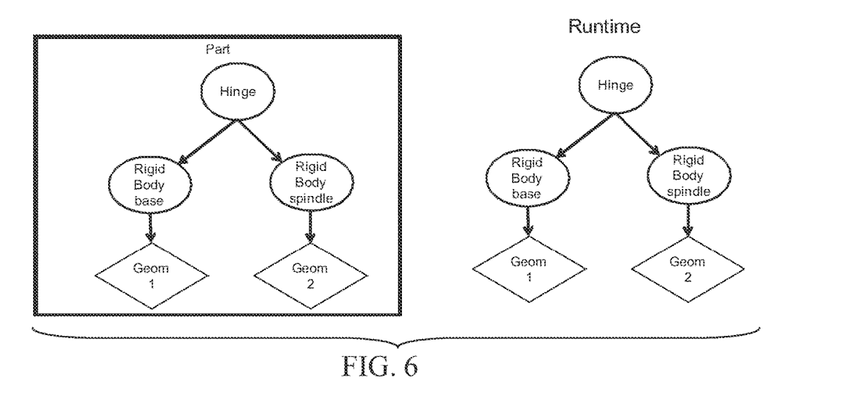
FIG. 6 is one embodiment of a graph showing design part file and runtime simulation structure.

Under normal circumstances, the running the simulation uses the same objects as specified at design time. For example, as shown in FIG. 6, the user might specify at design time that two rigid bodies are joined by a hinge joint. The runtime objects corresponding to these objects are effectively the same. The hinge and rigid body runtime objects are created for the simulation and start with the structure created at design time.

Figure 7:
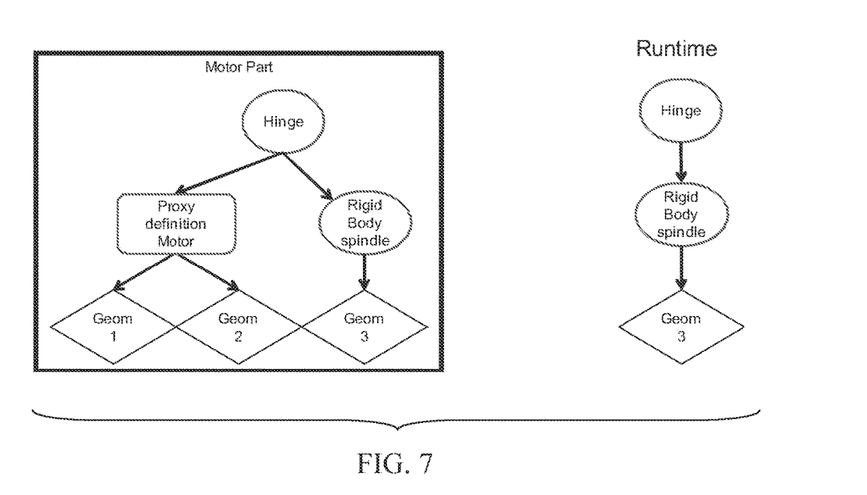
FIG. 7 is another embodiment of a graph showing design part file and runtime simulation structure.

A part with proxy bodies may not automatically create a rigid body for the proxy. If the user runs the Motor part by itself, the geometric items attached to the body have no rigid body. These geometric objects of the proxy are static as shown in FIG. 7. Only the spindle object in this case has a rigid body, so the hinge joint is only connected to the spindle. Static geometry, such as geometry object 1 and geometry object 2 do not need to be represented during runtime as these objects do not move or interact.

Figure 8:
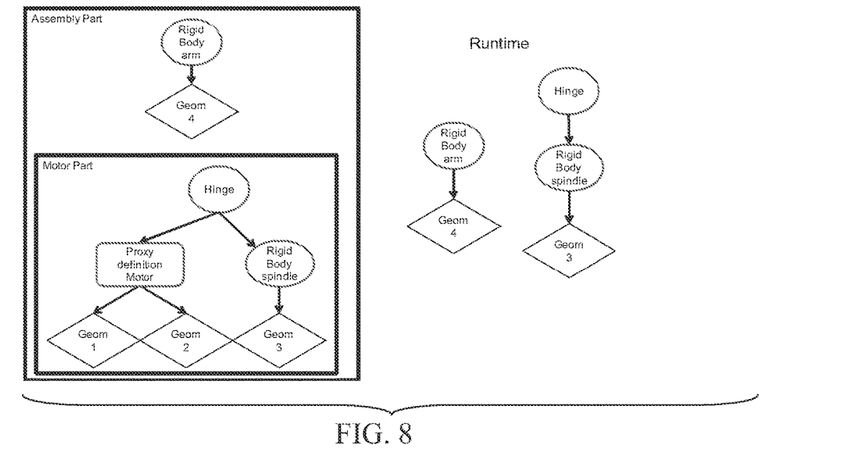
FIG. 8 is an example graph of a part file included within an assembly part file without an object linked to the proxy at design and runtime stages.
Figure 9:
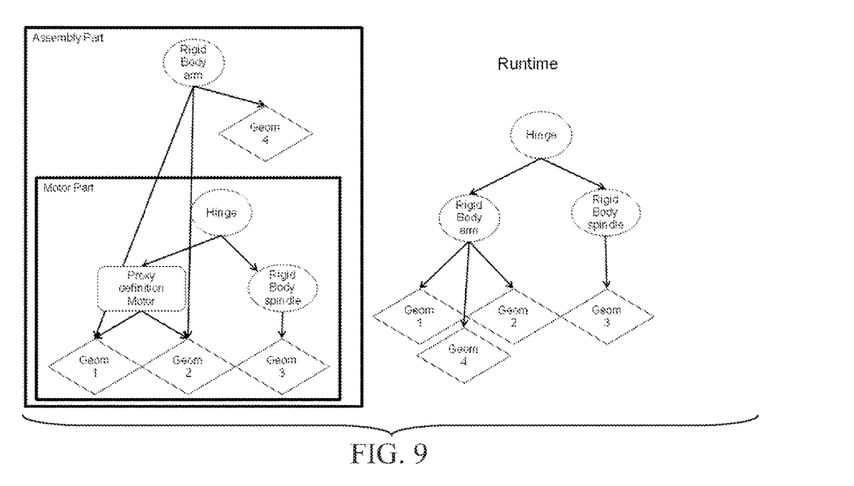
FIG. 9 is another example graph of a part file included within an assembly part file, but with an object linked to the proxy at design and runtime stages.

FIG. 8 shows the motor part added to another assembly that also contains physics objects at the assembly level. In this example, the simulation is being run without doing anything particular to the motor part. In this case, the motor remains static as when run individually. The rigid body for the robot arm is not associated with the motor contents or geometry, so there is no reason for them to behave as anything but independent objects. In FIG. 9, however, the motor part is also included in another assembly. The arm rigid body in the assembly includes the motor's geometry as members of the arm rigid body. By doing this, the user has indicated that the motor is to move about as part of the arm object. As specified, the runtime rigid body for arm references geometry objects 1, 2, and 4. The hinge joint specified in the motor proxy now has a different behavior because the proxy body has a rigid body with which to function. The runtime hinge joint is attached to the arm rigid body because that rigid body takes control of the proxy body. The hinge attaches the spindle rigid body to the arm rigid body at the position where the motor is located. The configuration works because the spindle is attached to the motor and the motor moves with the arm, thus, the spindle is attached to the arm.

As part of the control during runtime, the properties for one or more of the instances may be overridden. The values for one or more properties for controlling the physics may be changed. The change may be automatic as part of the design, such as having a speed that varies over time in the simulation. The change may be in response to user input. Since the proxy override objects and corresponding proxies of the part file maintain the values of the physics parameters separately for each instance, the operation may be changed before and during simulation. The values for one instance may be overridden without changing the values for another instance. By changing the values in the part file, the values for all of the instances may be changed. By making changes during simulation, the results in operation of the model may be viewed.

In act 32, the simulation is displayed over time. The various geometric objects of the parts files, such as the parts files with rigid bodies, proxies, joints, or other objects, represent a size, shape, and behavior of the represented part. The processor causes display of the appropriate size, shape, and behavior based on geometric and physics objects. The associated physics objects represent the movement or other changing characteristics of the various parts. The physics of the model are calculated and used to determine the position, orientation, velocities, and other physical properties of the parts for the simulation. Using the part files for the various components of the model, the processor simulates the assembly and generates a corresponding display. The display changes over time as a function of the physics. Changes in the rate, relative position, or other alteration may occur in response to changes in the values of the physics object parameters. These changes in motion may be viewed. The simulated model may move differently due to a change in one or more values. By viewing a sequence in the simulation, the change may be viewed.

FIG. 10 shows a block diagram of a system for modeling in three-dimensional simulation. The system includes a processor 16 and a memory 18. Additional, different, or fewer components may be provided. For example, an input device, such as a network card, wireless transceiver, and/or user input device are provided. As another example, a display, printer, network card, wireless transceiver and/or other output device is provided.

The computer processing performed by the processor 16 may be implemented in various forms of hardware, software, firmware, special purpose processors, or a combination thereof. Some embodiments are implemented in software as a program tangibly embodied on a non-transitory program storage device. By implementing with a system or program, creation of part files, control of a user interface for model design, and simulation is performed by the processor 16.

The processor 16 and/or memory 18 are part of a computer, personal computer, server, workstation, network processor, or other now known or later developed processing system. Various peripheral devices such as, for example, a display device, a disk storage device (e.g., a magnetic or optical disk storage device), a keyboard, a printing device, and a mouse, may be operatively coupled to the processor 16. A program may be uploaded to, and executed by, the processor 16. Likewise, processing strategies may include multiprocessing, multitasking, parallel processing and the like. The processor 16 is implemented on a computer platform having hardware such as one or more central processing units (CPU), a random access memory (RAM), and input/output (I/O) interface(s). The computer platform also includes an operating system and microinstruction code. The various processes and functions described herein may be either part of the microinstruction code or part of the program (or combination thereof) which is executed via the operating system. Alternatively, the processor 16 is one or more processors in a network.

The part files, objects, visual programming information, instructions, user input (map confirmation or alteration), rules, and/or other information are stored in a non-transitory computer readable memory, such as the memory 18. The memory 18 is an external storage device, internal storage device, RAM, ROM, and/or a local memory (e.g., solid state drive or hard drive). The same or different computer readable media may be used for the instructions and other data, such as the part files, override objects, proxy body information or assemblies. The memory 18 may be implemented using a database management system (DBMS) managed by the processor 16 and residing on a memory, such as a hard disk, RAM, or removable media. Alternatively, the memory 18 is internal to the processor 16 (e.g. cache). The memory 18 stores data used by or resulting from the simulation.

The instructions for implementing the processes, methods and/or techniques discussed herein are provided on computer-readable storage media or memories, such as a cache, buffer, RAM, removable media, hard drive or other computer readable storage media. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU or system. Because some of the constituent system components and method steps depicted in the accompanying figures are preferably implemented in software, the actual connections between the system components (or the process steps) may differ depending upon the manner in which the present embodiments are programmed.

The processor 16 is configured to perform creation of part files, such as using the dialog shown in FIG. 2, control of physics in simulation, such as using the dialog shown in FIG. 4 with an override proxy object, simulation, and display of the simulation. The processor 16 receives properties defining physics for one or more objects of an assembly. The processor 16 receives relative positioning and linking information for objects in a model. The processor 16 performs the simulation using the received information. Alternatively, a different processor is used for creation, design, and/or simulation.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for modeling in three-dimensional simulation, the method comprising:
    within a simulation processor, creating a parameterized first proxy body as part of a part file, that acts as a proxy for elements of the part file associated with rigid body behavior;
    instantiating, by the processor, the part file containing the parameterized first proxy body multiple times in a model of an assembly;
    propagating properties defined in the parameterized first proxy body, by the processor, of a first physics object to the multiple instantiations of the part file, the properties being settable differently for different ones of the instantiations and modifying the first physics object for a first instantiation of the multiple instantiations during the simulating, the modifying being performed during a runtime of the simulating after a start of the simulating and prior to a completion of the simulating, wherein the first physics object defines mass, movement, velocity, and/or articulation of a first rigid body;
    defining, by the processor, in an assembly the first rigid body;
    associating the first rigid body with the parameterized first proxy body through an encapsulated relationship with shared referenced objects; and
    simulating, by the processor, the assembly as a function of the multiple instantiations of the part file and the respective properties, wherein while the simulation is running tracking respective property changes of the multiple instances, wherein references to the first proxy body are replaced with the first rigid body if the first rigid body is associated with the first proxy body's geometry and no rigid body replacement is created for the first proxy body that is static during the simulation.

2. The method of claim 1 wherein the first rigid body comprises a collection of geometric objects that move together in the simulating, the first rigid body being precluded from having a direct connection to a geometric object attached to another rigid body such that all geometric objects moving together in the simulating are in the collection of the first rigid body.

3. The method of claim 1 wherein parameterizing comprises modeling a connection between (a) the first rigid body and (b) a second rigid body or joint based on the first physics object.

4. The method of claim 1 wherein the assembly comprises a geometric object;
    further comprising linking the first proxy body of a first instantiation of the part file with the geometric object;
        linking the first rigid body in the assembly to the same geometric object; and
    wherein simulating comprises moving the first rigid body with the geometric object.

5. The method of claim 1 wherein the first rigid body is not linked with a geometric object of the first proxy body, and wherein simulating comprises maintaining the geometric object in a static position relative to a background.

6. The method of claim 1 further comprising:
    displaying the simulation over time;
    overriding properties of the proxy body object for one or more of the multiple instantiations while simulating and displaying the simulation.

7. The method of claim 1 wherein instantiating comprises generating override objects for the first proxy body in the assembly, each proxy having a proxy definition from the part file.

8. The method of claim 7 wherein parameterizing comprises defining each proxy with a property list of values modifiable during simulation, encapsulation of the first physics object to implement operation of a part corresponding to the first proxy body during the simulation, and linking a geometric object.

9. The method of claim 1 wherein instantiating comprises loading a proxy definition into the assembly, making values of properties of the first proxy object available to the assembly for modification, and providing for change of the values in an override object in the assembly.

10. A non-transitory computer readable storage medium having stored therein data representing instructions executable by a programmed processor for modeling in three-dimensional simulation, the storage medium comprising instructions for:
    storing a part file including a proxy body and associated physics and geometries;
    using the part file multiple times for different instances of a corresponding part in an assembly wherein at least one of the different instances references the part file in another instance higher in a hierarchy of part files of the assembly;
    defining the physics of the proxy body for each use of the part file for the different instances separately by defining a proxy override for a first instance of the part during the simulation, modifying the physics of the proxy body for each use of the part file during runtime of the simulation;
    replacing during the simulation, a proxy body corresponding to the first instance of the part with a rigid body if the rigid body is associated with a geometry of the corresponding proxy body, and wherein no rigid body replacement is performed for a proxy body that is static during the simulation; and
    controlling, with the defined physics, each instance separately.

11. The non-transitory computer readable storage medium of claim 10 wherein the proxy body is lined with a rigid body, the rigid body comprising a collection of geometric objects that move together in the three-dimensional simulation, all the geometric objects moving relative to each other according to the physics.

12. The non-transitory computer readable storage medium of claim 10 further comprising modeling a connection between (a) the proxy body and (b) a rigid body or joint based on the physics.

13. The non-transitory computer readable storage medium of claim 10 wherein the part comprises a geometric object;
further comprising linking the proxy body of a first instance of the part with the geometric object and linking a rigid body in the assembly with the geometric object; and
wherein controlling comprises moving the rigid body with the geometric object.

14. The non-transitory computer readable storage medium of claim 10 wherein a rigid body is not linked with a geometric object of the part, and wherein controlling comprises maintaining the geometry object in a static position relative to a background.

15. The non-transitory computer readable storage medium of claim 10 further comprising:
displaying the simulation over time;
overriding the physics for one or more of the instances during the simulation and displaying the simulation.

16. The non-transitory computer readable storage medium of claim 10 wherein using comprises generating a proxy override object in the assembly, each proxy override object having a proxy body definition from the part file.

17. The non-transitory computer readable storage medium of claim 16 wherein defining comprises defining each proxy body definition with a property list of values modifiable during the simulation, encapsulation of the first physics object to implement operation of the part corresponding to the proxy body during the simulation, and linking a geometric object.

18. The non-transitory computer readable storage medium of claim 10 wherein using comprises loading a proxy definition into the assembly, making values of properties of the physics available to the assembly for modification, and providing for change of the values in an override object in the assembly.

19. A non-transitory computer readable storage medium having stored therein data representing instructions executable by a programmed processor for modeling in three-dimensional simulation, the storage medium comprising instructions for:
placing multiple instances of a part in the three-dimensional simulation, each part comprising a part file with a physics object wherein at least one of the different instances references the part file in another instance higher in a hierarchy of part files of the three-dimensional simulation;
defining properties representing an interface to the physics object in the part file of the part by proxy; and
maintaining values of the properties for the different instances of the part separately during the three-dimensional simulation by defining a proxy override for a first instance of the part during the simulation, modifying the properties for each of the different instances during runtime of the simulation; and
replacing during the simulation, a proxy body corresponding to the first instance of the part with a rigid body if the rigid body is associated with a geometry of the corresponding proxy body, and wherein no rigid body replacement is performed for a proxy body that is static during the simulation.

20. The non-transitory computer readable storage medium of claim 19 further comprising overriding the values for a first instance and not a second instance during the three-dimensional simulation.

* * * * *